United States Patent
Opheim

(10) Patent No.: US 7,183,654 B2
(45) Date of Patent: Feb. 27, 2007

(54) PROVIDING A VIA WITH AN INCREASED VIA CONTACT AREA

(75) Inventor: Tony A. Opheim, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 10/674,704

(22) Filed: Sep. 30, 2003

(65) Prior Publication Data
US 2005/0067711 A1    Mar. 31, 2005

(51) Int. Cl.
*H01L 23/52* (2006.01)
(52) U.S. Cl. ........................................ 257/775; 257/774
(58) Field of Classification Search ................ 257/774, 257/780, 698, 700; 438/629, 614
See application file for complete search history.

(56) References Cited

U.S. PATENT DOCUMENTS

| 4,954,875 | A | * | 9/1990 | Clements | 257/686 |
| 5,229,647 | A | * | 7/1993 | Gnadinger | 257/785 |
| 5,426,072 | A | * | 6/1995 | Finnila | 257/686 |
| 5,463,246 | A | * | 10/1995 | Matsunami | 257/621 |
| 6,429,509 | B1 | * | 8/2002 | Hsuan | 257/690 |

\* cited by examiner

*Primary Examiner*—Leonardo Andújar
(74) *Attorney, Agent, or Firm*—Blakely, Sokoloff, Taylor & Zafman LLP

(57) ABSTRACT

An apparatus and method to provide a via with an increased via contact area. A semiconductor support layer is coupled to a dielectric layer and a contact is coupled to the dielectric layer. A via, having an enlarged end within the semiconductor support layer, passes through the semiconductor support layer and the dielectric layer and connects to the contact. In one embodiment, the formation of the via and the enlarged end in the semiconductor support layer are completed in a single dry etch process.

9 Claims, 6 Drawing Sheets

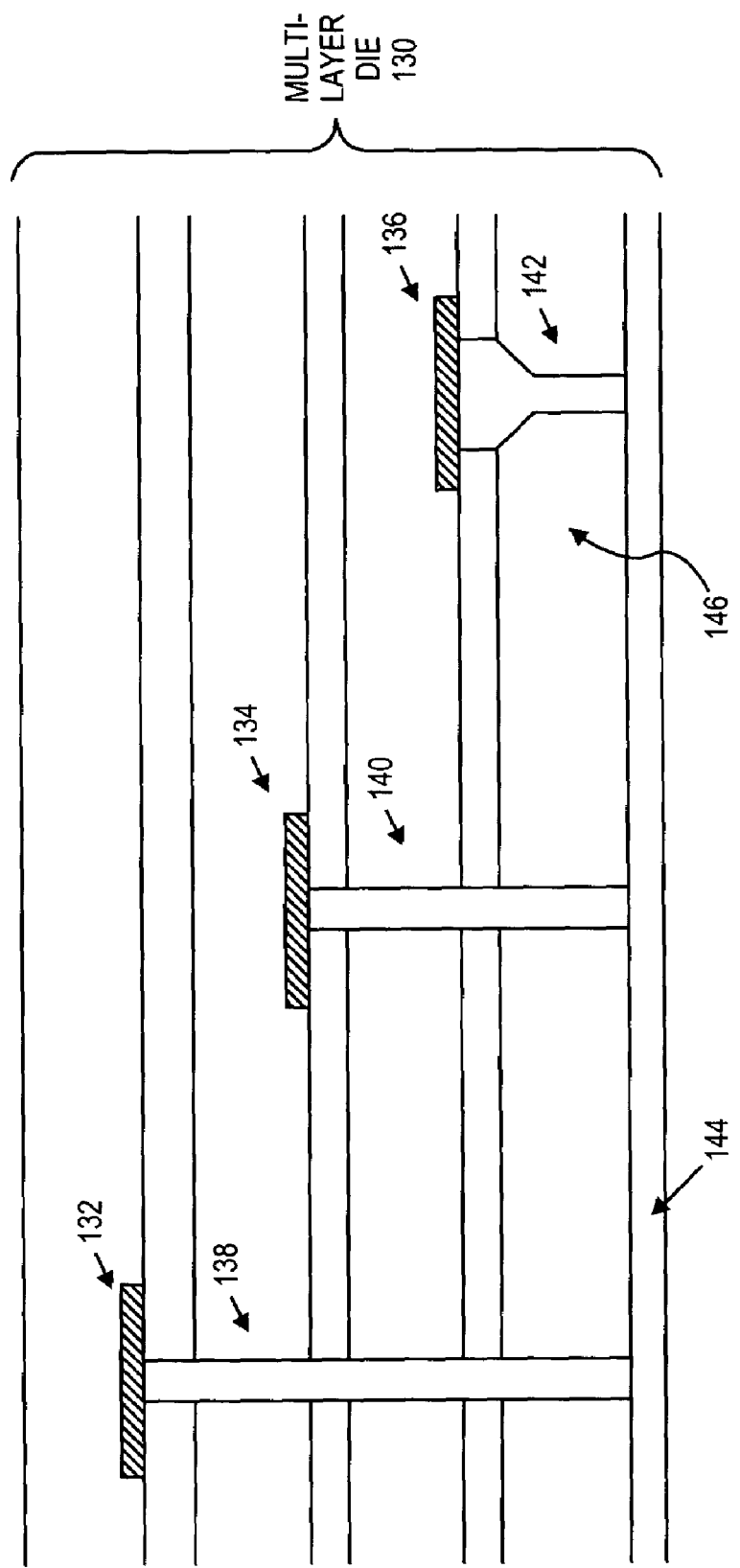

PROVIDING A VIA WITH AN INCREASED VIA CONTACT AREA

BACKGROUND

1. Field of Invention

The field of invention relates generally to vias and, more specifically, relates to a method and apparatus to provide a via with an increased via contact area.

2. Background Information

Semiconductor dies are typically encased in a shell or package prior to installation in microelectronic devices. The package makes the die easier to handle and protects the die from dust, dirt, and other contaminants. The package usually has leads or contact pads that are soldered to a printed circuit board (PCB). With its leads attached to the PCB, the package acts as an interface between the die and the PCB.

Generally, a die includes dielectric layers attached to a semiconductor support layer. Attached to the dielectric layers are metal layers. In some dies, a via is formed in the semiconductor support and dielectric layers to connect the metal layers to components outside of the die.

In constructing a die package, the diameter of the vias is usually kept to a minimum in order to help reduce electrical interconnect pitch. Electrical interconnect pitch (e.g., bump pitch) is the distance between the center of two electrical interconnects on a die package. In a die package, a via connects to an electrical interconnect which supplies electrical connection out of the package through bumps, pins, leads or other electrical connective items. Smaller diameter vias allow the vias to be placed closer together, and subsequently, reduce the electrical interconnect pitch. A smaller pitch leads to smaller die packages.

However, difficulties arise when a via with a small diameter is connected to a metal layer of a die. The small diameter of the via creates adhesion problems and may result in de-lamination of the via and the metal layer. Also, a connection with a small diameter via may result in undesired levels of electrical resistance in the connection between the via and the metal layer.

BRIEF DESCRIPTION OF THE DRAWINGS

The present invention is illustrated by way of example and not by limitation in the accompanying figures.

FIG. 1B is a cross-sectional view diagram illustrating one embodiment of a multi-layer die having at least one via with an increased via contact area in accordance with the teachings of the present invention.

DETAILED DESCRIPTION

Methods and apparatuses for providing a via with an increased via contact area are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the figures provided herewith are for explanation purposes to persons ordinarily skilled in the art and that the drawings are not necessarily drawn to scale.

Figure 1A:
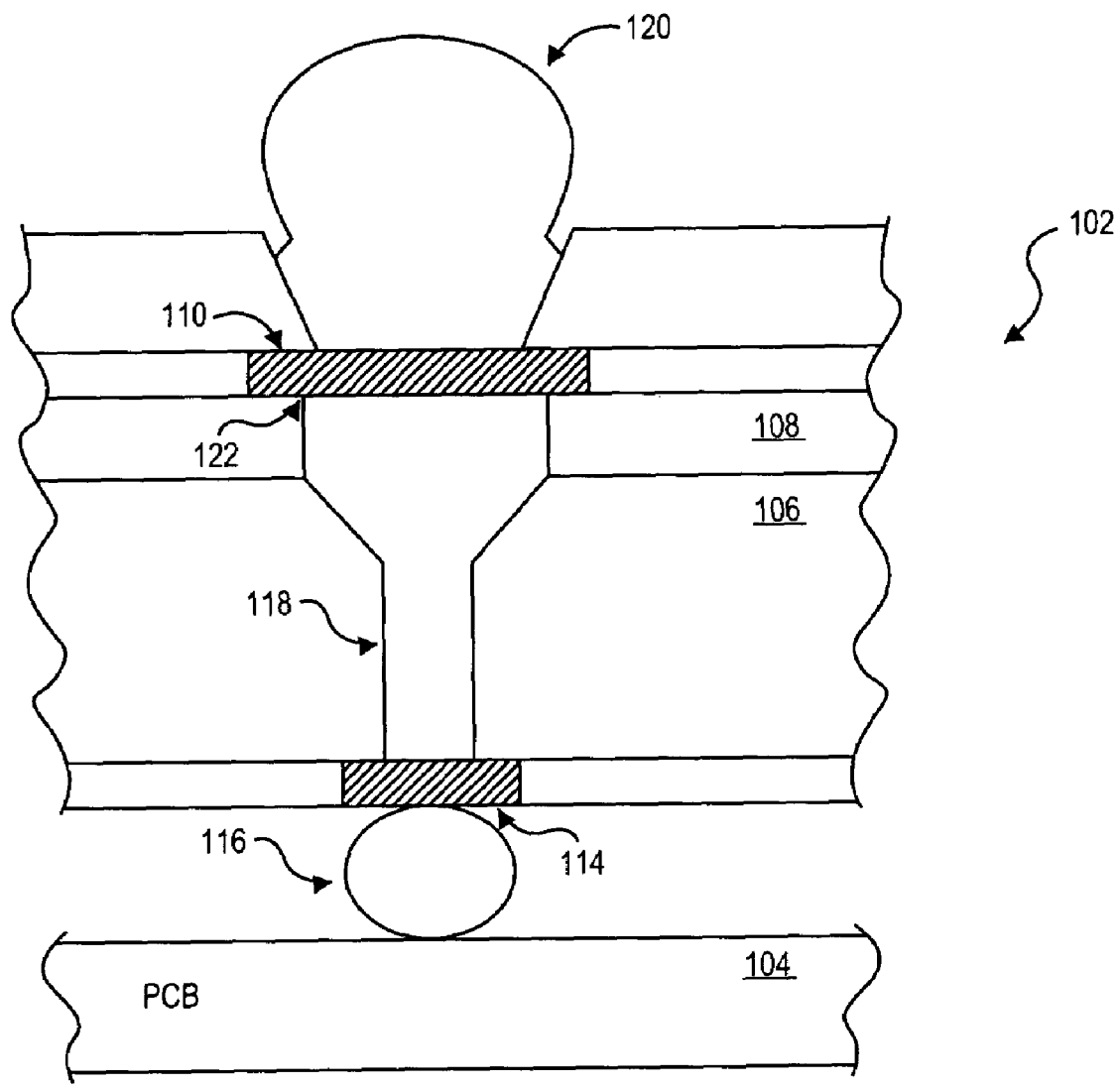
FIG. 1A is a cross-sectional view diagram illustrating one embodiment of a via having an increased via contact area in accordance with the teachings of the present invention.

FIG. 1A illustrates one embodiment of a via having an increased via contact area. FIG. 1A shows a die package 102 coupled to a printed circuit board (PCB) 104 by a solder ball 116. Die package 102 may be a "spider" type package, a wafer-level package, or the like. The die package 102 includes a semiconductor support layer 106 disposed proximate to dielectric layer 108. Disposed on dielectric layer 108 is a contact 110. Coupled to the contact 110 is a solder ball 120. Coupled adjacent to the contact 110 is a device (not shown). Such a device includes, but is not limited to, a transistor, capacitor, a resistor or the like. Package 102 also includes a contact 114. A via 118, having an increased via contact area 122, couples the contact 110 to contact 114.

FIG. 1B illustrates one embodiment of a multi-layer die having at least one via with an increased via contact area. In FIG. 1B, a multi-layer die 130 includes contacts 132, 134, and 136, where each contact is part of a different layer of the multi-layer die 130. Multi-layer die 130 also includes a conductive layer 144 and a semiconductor support layer 146. In one embodiment, conductive layer 144 is electrically coupled to a voltage source to provide power to the multi-layer die 130. Contact 132, 134, and 136 are each coupled to conductive layer 144 by vias 138, 140, and 142, respectively. Via 142 includes an increased via contact area as described herein.

Figure 1C:
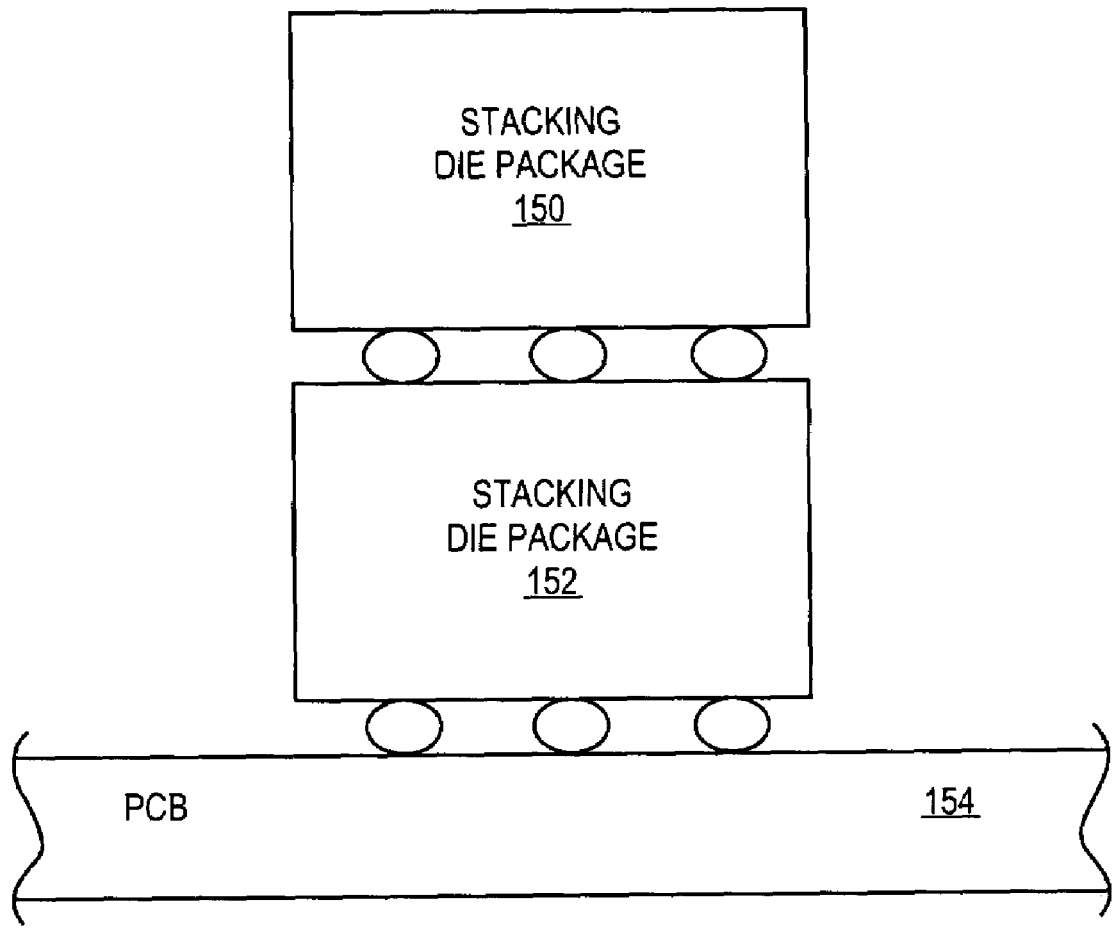
FIG. 1C is a cross-sectional view diagram illustrating one embodiment of stacking packages having at least one via with an increased via contact area in accordance with the teachings of the present invention.

FIG. 1C illustrates one embodiment of stacking dies packages having at least one via with an increased via contact area. In FIG. 1C, stacking die package 150 is electrically coupled to stacking die package 152. Stacking die package 152 is electrically coupled to PCB 154. In one embodiment, at least one of stacking die packages 150 and 152 has a via with an increased via contact area as described herein. In another embodiment, stacking die packages 150 and 152 each include multi-layer dies having vias with increased via contact areas.

Figure 2:
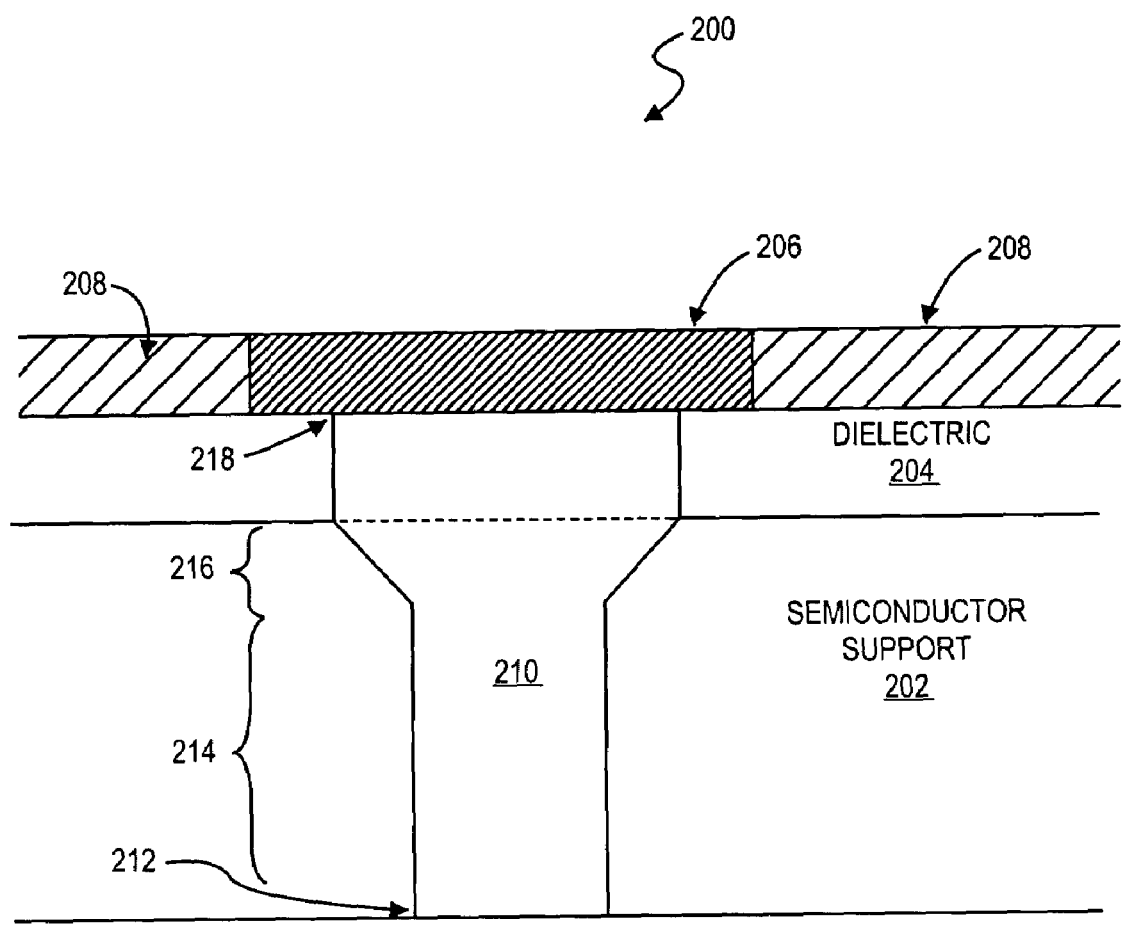
FIG. 2 is a cross-sectional view diagram illustrating one embodiment of a via having an increased via contact area in accordance with the teachings of the present invention.

FIG. 2 illustrates one embodiment of a die 200 with a via 210 having an increased via contact area. In one embodiment, via 210 is generally cylindrical in shape. Die 200 includes a semiconductor support layer 202 laminated to a dielectric layer 204. Semiconductor support layer 202 includes, but is not limited to, silicon, germanium, selenium, or the like. Dielectric layer 204 includes, but is not limited to, Silicon Dioxide ($SiO_2$), Silicon Nitride ($SiN_x$), or the like. Attached to the dielectric layer 204 is a contact 206. Contact 206 includes, but is not limited to, aluminum (Al), chromium (Cr), gold (Au), platinum (Pt), molybdenum (Mo), or the like, or any combination thereof. Adjacent to contact 206 and attached to the dielectric layer 204 is insulator 208. In one embodiment, the contact 206 is electrically coupled to a device (not shown) of die 200. In another embodiment, the contact 206 is coupled to a solder ball.

Via 210 is shown passing through the semiconductor support layer 202 and the dielectric layer 204. The via 210 is attached to contact 206. In one embodiment, via 210 is a metal-filled via. The portion of via 210 that passes through the semiconductor support layer 202 includes a bottom end 212, a shaft 214, and an enlarged end 216. The enlarged end 216 allows for an increased via contact area 218 for connection of via 210 to contact 206. The bottom end 212 may be electrically coupled to a PCB or another die package.

In one embodiment, the diameter of the bottom end 212 and the shaft 214 are substantially the same. At the enlarged end 216, the via extends outward from the center of the via 210 to form a semi-cone or bowl shape. In one embodiment, the largest diameter of the via at the enlarged end 216 is twice the diameter of the bottom end 212. In an embodiment, the diameter of the bottom end 212 is 10 to 60 microns. In yet another embodiment, the diameter of the increased via contact area 218 is 15 to 100 microns.

The via 210 passes through the dielectric layer 204 to connect to the contact 206 at the increased contact area 218 of the via 210. In one embodiment, the diameter of the via 210 through the dielectric layer 204 is similar to the largest diameter of the via 210 at the enlarged end 216. In another embodiment, the semi-cone shape at the enlarged end 216 continues through the dielectric layer 204 to the contact 206.

It will be understood that the enlarged end 216 of the via 210 begins in the semiconductor support layer 202 and increases in diameter as the via 210 approaches the dielectric layer 204. This enlarged end 216 tapers outward from the center of the via 210 to create an increased via contact area 218 for connection to contact 206. An increased via contact area adheres better to the contact and decreases the possibilities of de-lamination of the surrounding layers. Also, the large contact area of the via against the contact decreases the electrical resistance in the connection. Additionally, a narrow via diameter may still by used in the die to keep electrical interconnect pitches small, yet gain the advantages of an increased via contact area at the contact 206. The increased via contact area 218 also ensures connectivity to the contact 206. The increased via contact area 218 provides more surface to create a connection with the contact 206.

Figure 3:
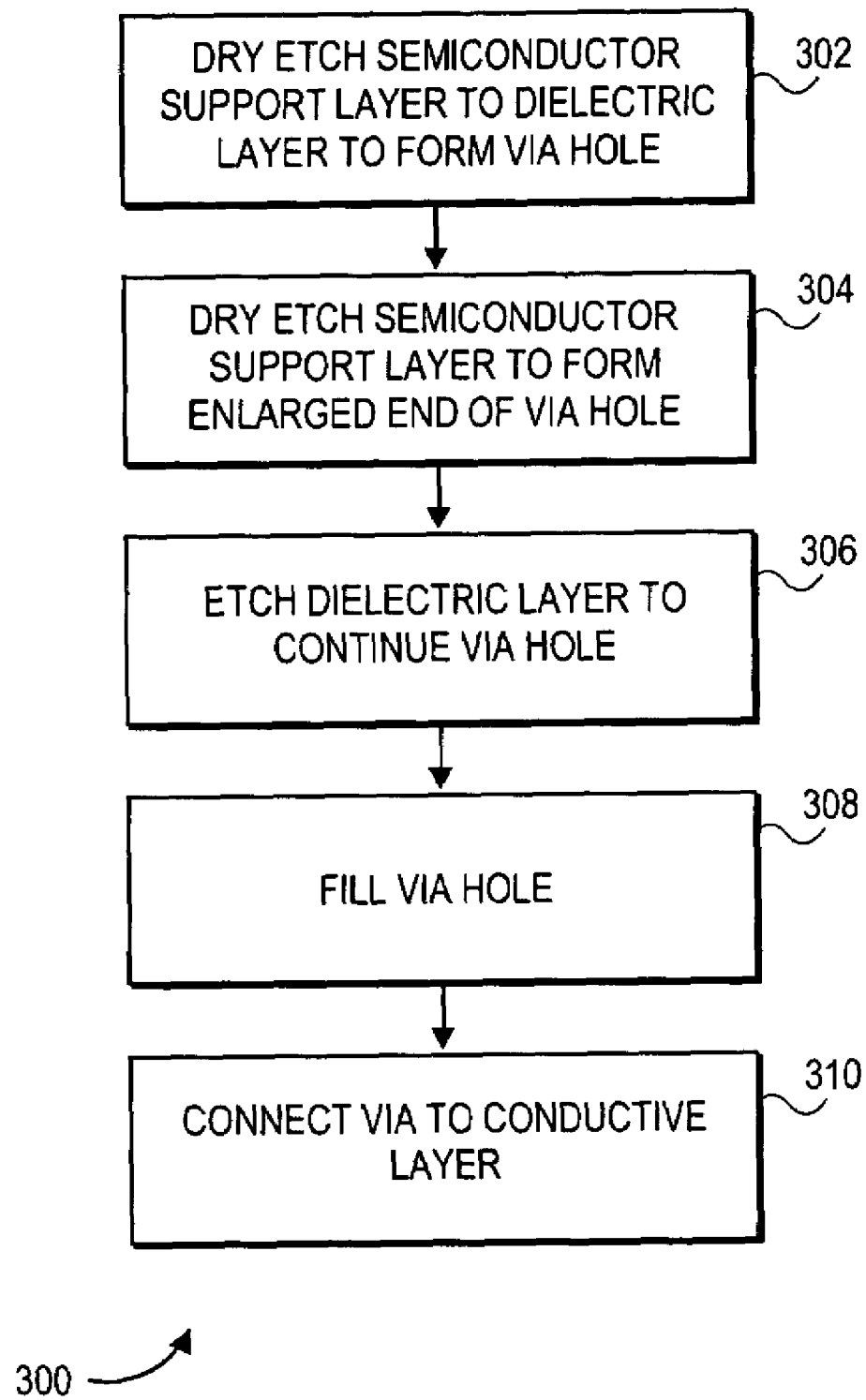
FIG. 3 is a flowchart illustrating one embodiment of the logic and operations to create a via having an increased via contact area in accordance with the teachings of the present invention.

FIG. 3 shows a flowchart 300 illustrating operations performed in accordance with an embodiment of the present invention. Starting in a block 302, a semiconductor support layer is dry etched to a dielectric layer of a die to form a via hole. Generally, the dry etch begins on the backside of the die. In one embodiment, dry etching is a deep reactive ion etching process. In general, this deep reactive ion etching technique involves alternating exposure of a wafer to an etchant plasma and a passivant. The process cycles between etching and deposition steps to create an etch with a vertical shape. In one embodiment, the dry etching tool is aligned with a conductive layer coupled to the dielectric layer before dry etching the semiconductor support layer to form the via hole.

Continuing to a block 304, the semiconductor support layer is dry etched to form an enlarged end of the via hole. The enlarged end forms a notch in the semiconductor support layer. The enlarged end will create a via with a large contact area to couple the via to a conductive layer within the die. In one embodiment, the dry etch process from block 302 is allowed to continue and creates a charge on the dielectric layer that repels the ions laterally forming the enlarged end in the semiconductor support layer. The shape of the enlarged end depends on how long the ions are allowed to etch in the semiconductor support layer. For example, the longer the ions are allowed to etch, the wider the enlarged end will be at the dielectric layer. In one embodiment, an anisotropic dry etch forms the via and the enlarged end in a single dry etch process.

In a block 306, the dielectric layer is etched to continue the via hole through the dielectric layer to a conductive layer. In one embodiment, the etch through the dielectric layer is conducted with a wet etch process. In another embodiment, the etch through the dielectric layer is conducted with the same dry etch process as was used to etch the via hole and the enlarged end. In another embodiment, the dielectric layer is etched so that the outward taper of the via hole continues from the semiconductor support layer, continues to taper outward through the dielectric layer, to the conductive layer.

Continuing in a block 308, the via hole is filled with a conductive material to create a via. In one embodiment, the via hole is filled with a metallized paste to form a metal-filled via. In another embodiment, a Chemical Vapor Deposition (CVD) process is used to fill the via hole.

In a block 310, the via is connected to the conductive layer. In one embodiment, a chemical reflow process is used to couple the enlarged end of the via to the conductive layer. In another embodiment, a thermal reflow process is used to connect the via to the conductive layer.

It will be appreciated that the via hole and the enlarged end in the semiconductor support layer may be completed in a single dry etch process. The diameter of the via is narrow along most of the depth of the via and increased at one end to increase the via contact area with the conductive layer. The etch of the semiconductor support layer, including the via hole and the enlarged end, can be completed in a single dry etch process; the use of build up layers is not required to create the enlarged end of the via. Thus, a large diameter via does not have to extend along the entire depth of the via, but only the diameter of the via at one end is increased to connect with the conductive layer.

Figure 4:
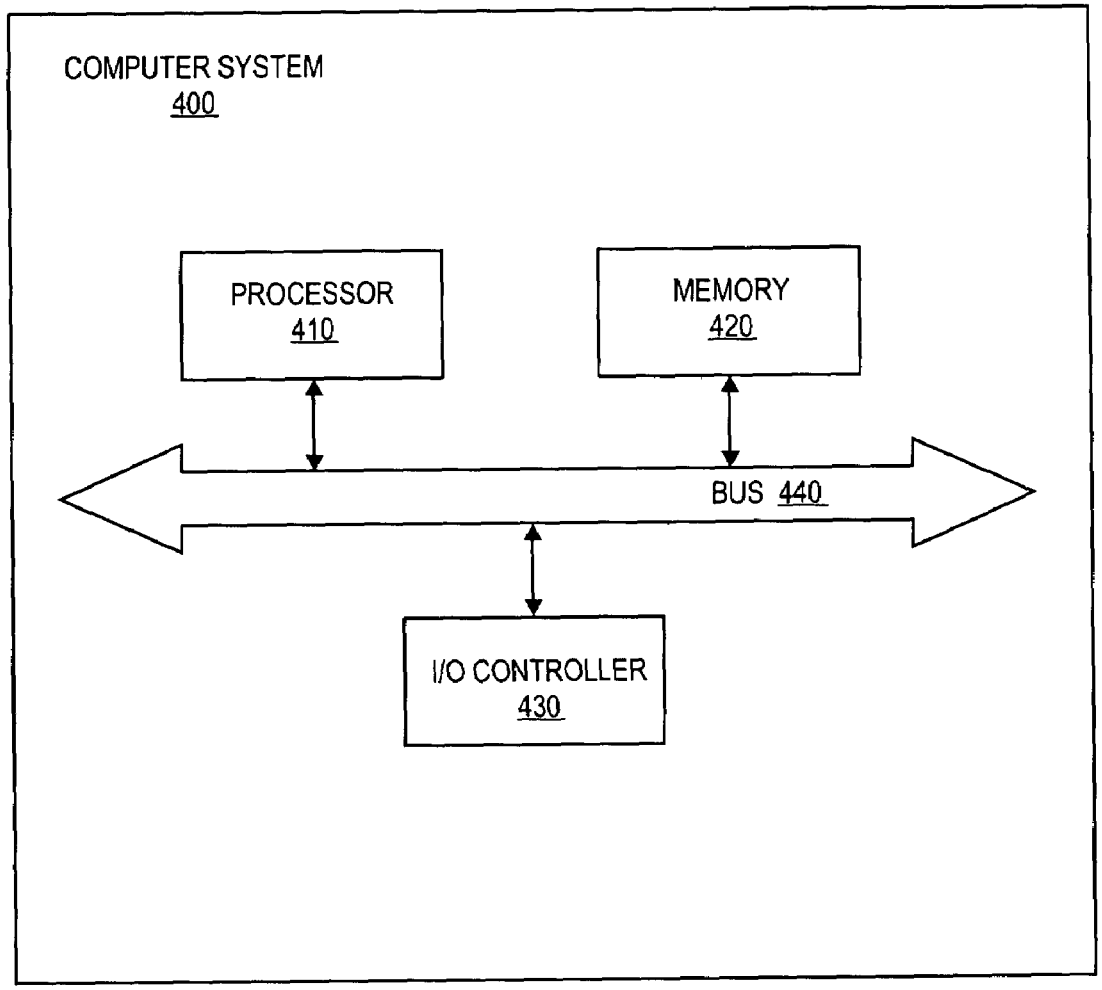
FIG. 4 is a diagram illustrating a computer system for implementing an embodiment of the present invention.

FIG. 4 is an illustration of one embodiment of an example computer system 400 that can be implemented in conjunction with an embodiment of the presently claimed invention. Computer system 400 includes a processor 410, a memory 420, and an input/output controller 430. Bus 440 is coupled to each of processor 410, memory 420 and input/output controller 430. Processor 410 may be a conventional microprocessor including, but not limited to, an Intel Corporation x86, Pentium, or Itanium family microprocessor, a Motorola family microprocessor, or the like. Memory 420 includes Dynamic Random Access Memory (DRAM), Static Random Access Memory (SRAM), Synchronized Dynamic Random Access Memory (SDRAM), Rambus Dynamic Random Access Memory (RDRAM), or the like. An input/output device (not shown) may be coupled to input/output controller 430. Such an input/output device includes, but is not limited to, a keyboard, a disk drive, a printer, a scanner and other input and output devices, including a mouse, trackball, trackpad, joystick, or other pointing device. In computer system 400, any one of the processor 410, memory 420, and input/output controller 430 may include a die package having a via with an increased via contact area as described herein.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A die, comprising:
   a dielectric layer positioned on top of a semiconductor support layer;
   a via passing through the dielectric layer and the semiconductor support layer, wherein a first end of the via is positioned in the dielectric layer and a second end of the via is positioned in the semiconductor support layer, wherein a first diameter of the first end is greater than a second diameter of the second end, wherein the second end of the via includes a shaft in the semiconductor support layer, the shaft including a shaft diameter similar to the second diameter, wherein the shaft tapers outward from a center of the via within the semiconductor support layer towards the dielectric layer to form a semi-cone shape in the semiconductor support layer, wherein the semi-cone shape forms an increased via contact area at the first end for coupling the via to a contact; and
   the contact positioned on top of the dielectric layer, the contact coupled to the first end of the via.

2. The die of claim 1 wherein the via continues to taper outwards from the second end into the first end to form a semi-cone shape in the dielectric layer.

3. The die of claim 1 wherein a diameter of the first end is similar to a diameter of the semi-cone shape, the first end to form a cylinder shape in the dielectric layer.

4. The die of claim 1 wherein the via includes a metal-filled via.

5. A die package, comprising:
   a semiconductor support layer;
   a dielectric layer disposed on the semiconductor support layer;
   a via including a first end and a second end, the first end positioned in the dielectric layer and the second end positioned in the semiconductor support layer, wherein a diameter of the first end is greater than a diameter of the second end, wherein the second end includes a shaft and an enlarged end in the semiconductor support layer, the enlarged end between the shaft and the first end, wherein the enlarged end tapers outward from a center of the via within the semiconductor support layer towards the dielectric layer, the enlarged end defining a semi-cone shape, wherein the enlarged end creates an increased via contact area at the first end for coupling the via to a first contact;
   the first contact, disposed on the dielectric layer, coupled to the first end of the via; and
   a second contact, disposed on the semiconductor support layer, coupled to the second end of the via, wherein the second contact to be mounted to a printed circuit board.

6. The die package of claim 5 wherein the first end continues to taper outwards from the enlarged end to form a semi-cone shape in the dielectric layer.

7. The die package of claim 5 wherein a diameter of the first end of the via through the dielectric layer is similar to a diameter of the semi-cone shape, the first end to form a cylinder shape in the dielectric layer.

8. A system, comprising:
   a printed circuit board (PCB); and
   a processor coupled to the PCB, wherein the processor includes:
      a dielectric layer positioned on top of a semiconductor support layer;
      a via passing through the dielectric layer and the semiconductor support layer, wherein a first end of the via is positioned in the dielectric layer and a second end of the via is positioned in the semiconductor support layer, wherein a first diameter of the first end is greater than a second diameter of the second end, wherein the second end includes a shaft in the semiconductor support layer, the shaft including a shaft diameter similar to the second diameter, wherein the second end tapers outward from a center of the via within the semiconductor support layer towards the dielectric layer, the second end defining a semi-cone shape in the semiconductor support layer; and
      a first contact positioned on top of the dielectric layer, the first contact coupled to the first end of the via, wherein the second end of the via is coupled to the PCB via a second contact.

9. The system of claim 8 wherein the first diameter is approximately twice the second diameter.

* * * * *